United States Patent [19]

Kit

[11] Patent Number: 5,654,646

[45] Date of Patent: Aug. 5, 1997

[54] APPARATUS FOR TESTING PRINTED CIRCUIT BOARDS

[75] Inventor: Kwok Sui Kit, Hong Kong, Hong Kong

[73] Assignee: Centalic Technology Development Ltd., Hong Kong

[21] Appl. No.: 451,181

[22] Filed: May 26, 1995

[51] Int. Cl.⁶ .................................................. G01R 15/12
[52] U.S. Cl. ................................... 324/754; 324/537
[58] Field of Search ......................... 324/158.1, 73.1, 324/754, 72.5, 755, 500, 537; 439/482

[56] References Cited

U.S. PATENT DOCUMENTS

| | | |
|---|---|---|
| 4,012,693 | 3/1977 | Sullivan . |
| 4,056,773 | 11/1977 | Sullivan . |
| 4,115,735 | 9/1978 | Stanford . |
| 4,342,957 | 8/1982 | Russell ........................ 324/754 |
| 4,342,958 | 8/1982 | Russell ........................ 324/754 |
| 4,471,298 | 9/1984 | Frohlich ...................... 324/72.5 |
| 4,571,542 | 2/1986 | Arai . |
| 4,707,657 | 11/1987 | Boegh-Petersen ............ 324/537 |
| 4,841,241 | 6/1989 | Hila et al. . |
| 4,904,935 | 2/1990 | Calma et al. . |
| 4,943,768 | 7/1990 | Niki et al. ..................... 324/754 |
| 5,109,596 | 5/1992 | Driller et al. ................. 324/754 |
| 5,214,374 | 5/1993 | St. Onge . |

FOREIGN PATENT DOCUMENTS

| | | |
|---|---|---|
| 0 250 620A1 | 1/1988 | European Pat. Off. . |
| 2156532 | 10/1985 | United Kingdom . |
| 2215064 | 9/1989 | United Kingdom . |
| 2265224 | 9/1993 | United Kingdom . |
| WO 89/00296 | 1/1989 | WIPO . |

*Primary Examiner*—Vinh P. Nguyen
*Attorney, Agent, or Firm*—Pollock, Vande Sande & Priddy

[57] ABSTRACT

A testing apparatus is disclosed as including an isolation test probe adapted to effect an isolation test on a circuit board, and a continuity test device adapted to then effect a continuity test on the circuit board. The continuity test device includes the isolation test probe and two continuity testing members which are movable sequentially.

14 Claims, 2 Drawing Sheets

APPARATUS FOR TESTING PRINTED CIRCUIT BOARDS

This invention relates to a testing system for circuit board units such as printed circuit boards (PCB).

It is an object of this invention to provide a better testing system for PCB's over some traditional testing systems.

Testing apparatus in accordance with the invention comprises continuity test means to effect a continuity test on the same circuit board, the continuity test means including at least two testing members which are sequentially moved.

Suitably the apparatus includes isolation test means to effect an isolation test on a circuit board, the isolation test means is a probe(s) to contact a certain point on the circuit board, thereby checking for any shorts in the circuit board.

Preferably the continuity test means includes use of the isolation test means, in particular the isolation test means and the at least two testing members constitute the continuity test means.

Advantageously each testing member is a member supporting at least one strip of conductive rubber in order to bridge two points on the circuit board, thereby checking for any line breaks in the circuit board.

Preferably the support member is moved towards and away from the circuit board by cylinder means.

Each testing apparatus suitably uses a miniature pneumatic cylinder which is actuated through a bypass valve which is controlled by a fully computerized system.

The support member suitably comprises conductive material mounted in grooves on a metal platform. Part of the conductive material is exposed above the surface of the platform for contact with the circuit board. The action of the cylinder means presses the conductive material onto the circuit board so that continuity testing of the circuit board can be achieved.

The apparatus provided for accurate testing of all compact and high density bareboards with SMT (Surface Mount Technology). The apparatus is particularly useful with Automatic Conductive Rubber Testing (ACRT) systems.

Preferably the at least two testing members are sequentially moved one after the other to test the same component of a circuit board.

Such provides the advantage that a circuit board having several groups of SMT pads will be correctly tested for faults. In particular, such properly tests circuit boards having a common line between two SMT pads.

The invention will now be described by way of example with reference to the accompanying drawings in which.

Figure 1:
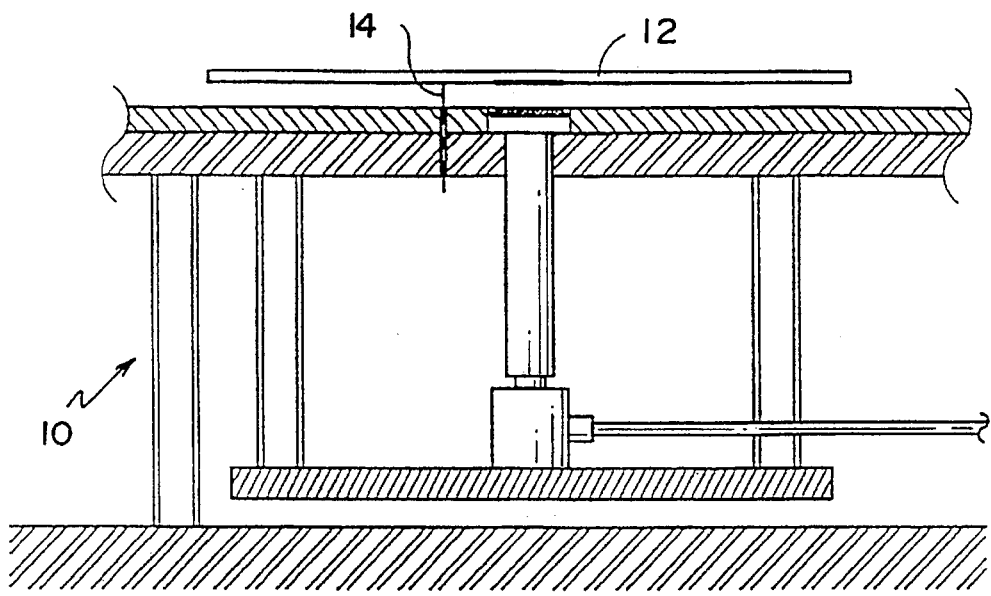
FIG. 1 is a side cross-sectional view of a testing apparatus, in its isolation test condition.
Figure 2:
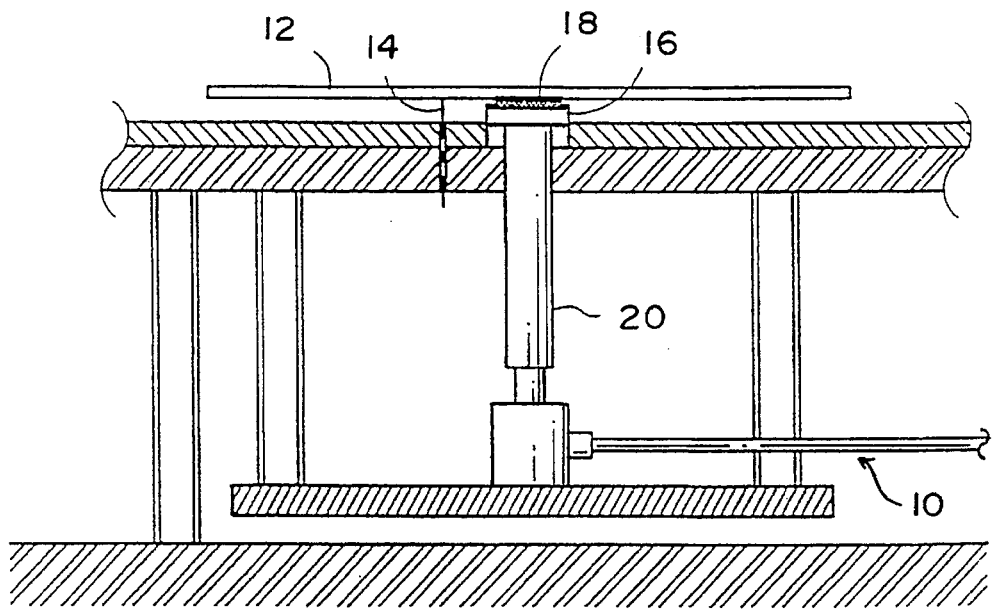
FIG. 2 is a side cross-sectional view of the apparatus in FIG. 1, in its continuity test condition.

In FIGS. 1 and 2 a testing apparatus 10 is shown to give isolation and continuity tests on a printed circuit board 12.

In particular, the apparatus comprises an isolation test member in a form of a probe 14 which is movable up and down to contact certain points on the printed circuit board (see FIG. 1).

In FIG. 2 the same apparatus is shown to undertake a continuity test on the printed circuit board.

In particular, the isolation probe together with a member 16 supporting a mask 18 made of conductive rubber, which mask can bridge two points on the printed circuit board, act together to give the continuity test feature.

The apparatus includes a cylinder mechanism 20 for moving up and down the supporting member 16 towards and away from the printed circuit board.

The arrangement is controlled by a system controller, details of which follow:

SYSTEM CONTROLLER

The system controller unit recognizes if the user selects the testing function by checking a parameter "ACRT State" in a sub-menu "Product configure".

If the "ACRT State" is set to "On", the system controller will test and learn the PCB with the ACRT function.

Using ACRT, the PCB will be learned with two different processes. In particular, the data files of the PCB with ACRT function include two different sets of data. Data (Data1) is first learned Without contact between the conductive rubber 18 and the tested board 12, and data (Data2) is then learned with contact between the conductive rubber and the tested board.

In testing, the PCB will be tested with two different processes according the two different sets of data. First, the conductive rubber will contact with the tested board and start testing according to the information of Data2. Then, the conductive rubber will uncontact with the tested board and start testing according to the information of Data1.

The system controller controls the state of the cylinder in the apparatus. If the conductive rubber 18 is needed to contact with the tested board 12, the controller will send a signal to make the cylinder move up, otherwise; the controller will send another signal to make the cylinder move down.

The pneumatic cylinder 20, which is used to activate the action of the platform 16, is under the full control of a computer. This structure enables the testing operation to be optimized in one cycle for multi-adaptation test.

Figure 3:
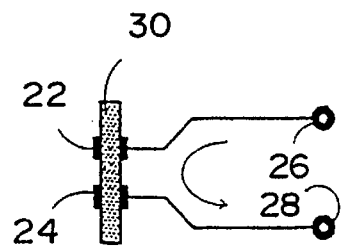
FIG. 3 is a schematic diagram of a bare board.

Referring to FIG. 3, part of the PCB 12 is shown under test. In particular, two adjacent SMT pads 22 and 24 on the PCB are shown with their corresponding ends or branching ends being in contact by testing probes 26 and 28. Special conductive material 30 is employed to act as a "conductive bridge/short" between the two SMT pads 22 and 24.

The learning and testing mechanism consists of two stages. In the first stage, the conductive material 30 is in contact with every SMT pad (ie 22 and 24) so that a short path is provided between every SMT pad. The "OPEN/SHORT" reading at each testing probe is treated as the first set of data (ie Continuity Test). In the second stage, the special conductive material 30 is isolated from every SMT pad (ie 22 and 24). Another "OPEN/SHORT" reading at every testing probe is treated as the second set of data (ie Isolation Test).

The testing procedure will employ these two sets of data as reference to compare with the data generated by the unit under test in the two stages. However, all the testing stages stated above do not require the removal of the unit under test or movement of the apparatus other than the cylinder. The mechanism provided completes the test in just one cycle.

OPERATION

1. To learn a test program with ACRT function:
   a. Select the correct parameters of "System configure" and "Product configure". In the sub-menu "Product configure", the "ACRT state" should be set to "On".
   b. Select the sub-menu "Test/Learn".
   c. Select the item "Start Learn".
   d. Insert a "known good" PCB onto the apparatus.
   e. Make the cylinder press the conductive rubber tightly with the PCB.
   f. When the learning is finished, the machine will display number of short and number of open points of the PCB, and also if there exists check sum error.
   g. Save the test pattern.
2. To test PCB with ACRT function:
   a. Load the data file of the tested board if it has been saved on the disk. Otherwise learn the board before testing.
   b. Select the correct parameters in "System Configure" and "Product Configure". Make sure that the "ACRT state" in the sub-menu "Product configure" should be set to "On".
   c. Select the sub-menu "Test/Learn".
   d. Select the item "Start Test".
   e. Insert a PCB onto the apparatus.
   f. Make the cylinder press the conductive rubber tightly with the PCB.
   g. When the testing is ended, the cylinder will be up and the machine will display if the board is passed or failed.

The ACRT is an excellent tool for testing of PCB with SMT (Surface Mount Technology), Chip on Board (COB), bonding in single-sided, double-sided and multi-layer board.

Using the system as described in FIGS. 1 to 3 for PCB testing can solve the problems of testing high density bareboard with SMT. The SMT pads are shorted by conductive rubber (moving the cylinders up) and then testing their continuity. If the units under test (uut) contains several groups of SMT pads, the fixture is provided with an equal number of cylinders in corresponding position, and such are tested simultaneously. For a tester with a system as described in FIGS. 1 to 3, the testing procedure will involved two stages, one is testing without conductive rubber and the other is testing with conductive rubber.

However, testing with the system as described in FIGS. 1 to 3 has a limitation if the test points have connections with two or more groups of the SMT pads, since if a track (or line) between two SMT pads is broken, the test will not find the fault.

Figure 4:
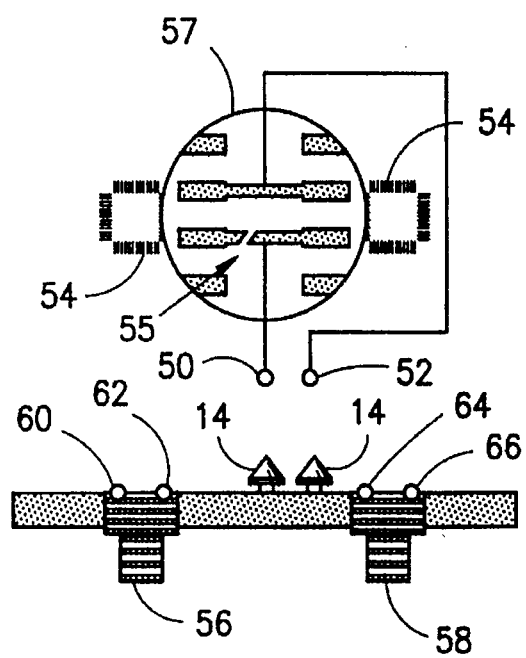
FIG. 4 is a schematic diagram of the bottom of a bare board in contact with a testing apparatus, showing the testing apparatus in one position.
Figure 5:
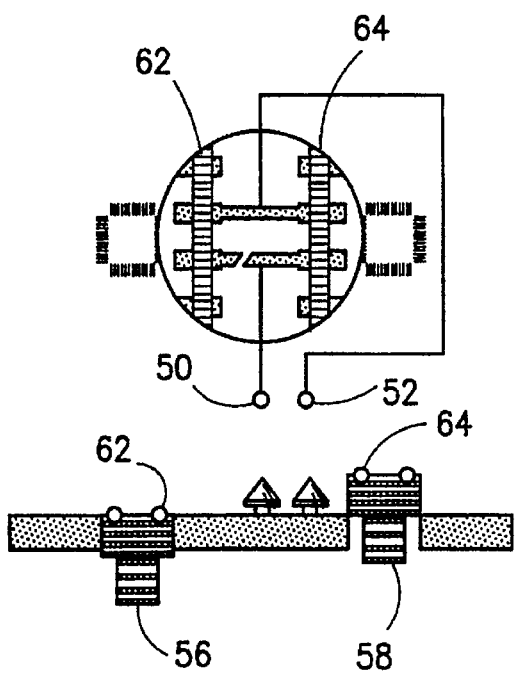
FIG. 5 is a schematic diagram of the arrangement of FIG. 4, showing the testing apparatus in another position.

For example, in FIG. 4, both points 50 and 52 have connection with two groups of SMT pads 54, but there is an open fault in the track 55 of point 50 (shown enlarged—see 57). After continuity testing with both cylinders 56 and 58 being moved simultaneously upward (see FIG. 5), there is still a connecting path between points 50 and 52. Hence the open fault in track 55 cannot be detected.

Figure 6:
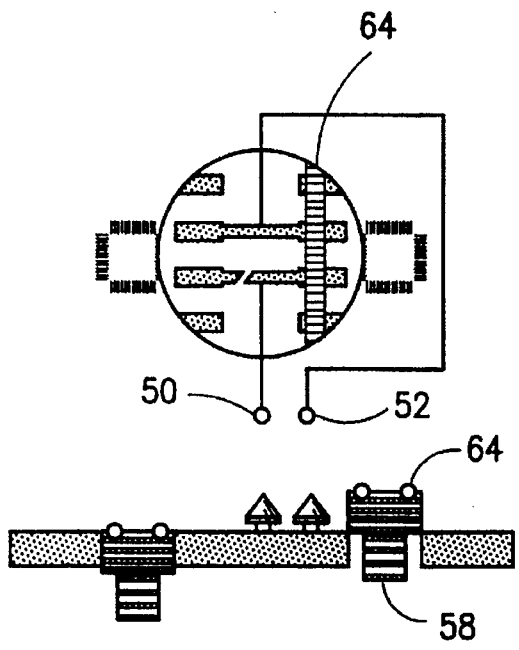
FIG. 6 is a schematic diagram showing the bottom of a bare board in contact with testing apparatus in accordance with the invention.
Figure 7:
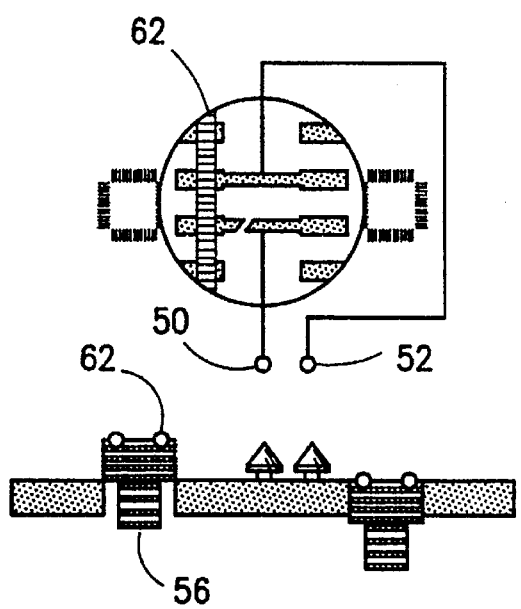
FIG. 7 is a schematic diagram of the arrangement of FIG. 4, showing the testing apparatus in a yet further position and also in accordance with the invention.

The modified system shown in FIGS. 6 and 7 can solve this problem. In particular, if the uut contains several groups of pads, the cylinders are moved upward one by one, i.e. sequentially during testing in the modified system. Any open fault in any track can thus be detected even if the track is connected with more than one group of SMT pads.

For example, testing under the modified system is illustrated by FIGS. 6 and 7. First, the cylinder 58 is moved upward for testing (see FIG. 6). Thereafter the cylinder 56 is moved upward for testing (see FIG. 7). Although the open fault will not be detected in the first test stage, it is detected in the second test.

In FIGS. 4 to 7, the cylinders 56 and 58 are shown provided at the top end thereof with a mask made of at least two strips of conductive rubber, so as to bridge a number of points on each SMT pad. In particular, the cylinder 56 is provided with two conductive rubber strips 60 and 62, whilst cylinder 58 is provided with two conductive rubber strips 64 and 66.

The modified system offers the PCB manufacture a stable and reliable testing of high density) SMT pads with lower cost and higher throughput.

I claim:

1. A testing apparatus for testing a circuit board having a plurality of electrically conductive tracks, said apparatus comprising an isolation test means adapted to effect an isolation test on the circuit board, and a continuity test means adapted to effect a continuity test on the circuit board, wherein the continuity test means comprises the isolation test means, at least two continuity testing members which are movable, and means for moving said continuity testing members sequentially such that an open fault in either one of at least two of said electrically conductive tracks is detectable by said sequential movement of said continuity testing member.

2. A testing apparatus according to claim 1 wherein at least one of the testing members comprises at least one strip of electrically conductive rubber which contacts together two points on the circuit board.

3. A testing apparatus according to claim 2 wherein the isolation test means comprises at least one probe adapted to contact a certain point on, and thereby to effect an isolation test on, the circuit board.

4. A testing apparatus according to claim 1 wherein each of the testing members comprises at least a respective strip of electrically conductive rubber which contacts together two points on the circuit board.

5. A testing apparatus according to claim 1 wherein the isolation test means comprises at least one probe adapted to contact a certain point on, and thereby to effect an isolation test on, the circuit board.

6. A testing apparatus according to claim 4 wherein the isolation test means comprises at least one probe adapted to contact a certain point on, and thereby to effect an isolation test on, the circuit board.

7. A testing apparatus according to claims 1, 2, 4, 5, 3 or 6 wherein the apparatus comprises a support member adapted to be selectively movable towards or away from the circuit board by cylinder means.

8. A testing apparatus according to claim 7 wherein the support member comprises a platform and electrically conductive material mounted in grooves on the platform.

9. A testing apparatus according to claim 8 wherein part of the electrically conductive material is exposed above the surface of the platform for contacting the circuit board being tested.

10. A testing apparatus according to claim 9 wherein the cylinder means includes means for pressing the electrically conductive material onto the circuit board being tested.

11. A testing apparatus according to claim 8 wherein the cylinder means includes means for pressing the electrically conductive material onto the circuit board being tested.

12. A testing apparatus according to claim 7 wherein the support member comprises electrically conductive material, and wherein the cylinder means includes means for pressing the electrically conductive material onto the circuit board being tested.

13. A testing apparatus according to claim 1 wherein a first one of said testing members is adapted to contact together first and second points on the circuit board; and wherein a second one of said testing members is adapted to contact together third and fourth points on the circuit board, said first and third points being electrically connected by a first track and said second and fourth points being electrically connected by a second track, such that an open fault in either one of said first and second tracks is detectable by sequential movement of said at least two continuity testing members.

14. A testing apparatus according to claim 13 wherein said isolation test means comprises a first probe adapted to be electrically connected to said first and third points on the circuit board, and a second probe adapted to be electrically connected to said second and fourth points on the circuit board.

* * * * *